United States Patent
Shirato et al.

(10) Patent No.: US 12,264,228 B2
(45) Date of Patent: Apr. 1, 2025

(54) GRAPHITE COMPOSITE AND ELECTRONIC COMPONENT

(71) Applicant: Panasonic Intellectual Property Management Co., Ltd., Osaka (JP)

(72) Inventors: Youji Shirato, Hokkaido (JP); Norihiro Kawamura, Hokkaido (JP); Yoshifumi Iimuro, Hokkaido (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 124 days.

(21) Appl. No.: 17/876,168

(22) Filed: Jul. 28, 2022

(65) Prior Publication Data

US 2023/0032968 A1 Feb. 2, 2023

(30) Foreign Application Priority Data

Jul. 29, 2021 (JP) .................................. 2021-124733

(51) Int. Cl.
*C08K 3/00* (2018.01)
*C08K 3/04* (2006.01)
*H01L 23/373* (2006.01)

(52) U.S. Cl.
CPC .......... *C08K 3/042* (2017.05); *H01L 23/3737* (2013.01)

(58) Field of Classification Search
CPC ............................ C08K 3/042; H01L 23/3737
See application file for complete search history.

(56) References Cited

U.S. PATENT DOCUMENTS

| | | | |
|---|---|---|---|
| 9,831,153 B1 * | 11/2017 | Huang | H01L 23/4006 |
| 2012/0048528 A1 * | 3/2012 | Bergin | H01L 23/3733 252/78.3 |
| 2016/0219752 A1 * | 7/2016 | Nakayama | H05K 7/2039 |
| 2022/0199429 A1 * | 6/2022 | Shah | H01L 21/4882 |

FOREIGN PATENT DOCUMENTS

JP 2016-076678 A 5/2016

OTHER PUBLICATIONS

JP 2016-076678 A ; English Translation (Year: 2016).*

* cited by examiner

*Primary Examiner* — Pete T Lee
(74) *Attorney, Agent, or Firm* — Rimon P.C.

(57) ABSTRACT

A graphite composite includes a graphite sheet having a void inside and a resin member. The void is partially filled by at least a part of the resin member in its entirety. The proportion of the resin member to the sum of the graphite sheet and the resin member is equal to or greater than 5% by mass. The graphite composite has a porosity equal to or greater than 50% by volume and equal to or less than 95% by volume.

18 Claims, 1 Drawing Sheet

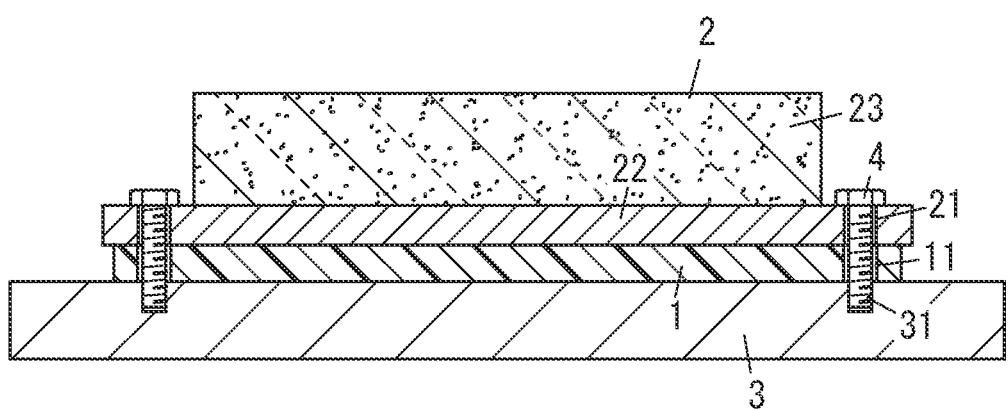

GRAPHITE COMPOSITE AND ELECTRONIC COMPONENT

CROSS-REFERENCE TO RELATED APPLICATIONS

The present application is based upon, and claims the benefit of priority to, Japanese Patent Application No. 2021-124733, filed on Jul. 29, 2021, the entire contents of which are hereby incorporated by reference.

TECHNICAL FIELD

The present disclosure generally relates to a graphite composite and an electronic component. More particularly, the present disclosure relates to a graphite composite including a graphite sheet and a resin member and an electronic component including such a graphite composite.

BACKGROUND ART

JP 2016-076678 A teaches making a thermal interface sheet by impregnating and filling vacancies of a graphite sheet with a heat softening silicone resin, which is substantially solid at room temperature, thereby preventing graphite components from peeling off the thermal interface sheet and also preventing a graphite powder from scattering. In addition, according to JP 2016-076678 A, such a thermally conductive sheet not only has a certain degree of tackiness on the surface, thus making it easier to mount such a sheet, but also has excellent heat dissipation properties.

SUMMARY

The present disclosure provides a graphite composite including a graphite sheet and a resin member and having the ability to increase, when interposed between a heat generator and a heat dissipator, the degree of heat transfer from the heat generator to the heat dissipator. In addition, the present disclosure also provides an electronic component including such a graphite composite.

A graphite composite according to an aspect of the present disclosure includes: a graphite sheet having a void inside; and a resin member. The void is partially filled by at least a part of the resin member in its entirety. The proportion of the resin member to the sum of the graphite sheet and the resin member is equal to or greater than 5% by mass. The graphite composite has a porosity equal to or greater than 50% by volume and equal to or less than 95% by volume.

An electronic component according to another aspect of the present disclosure includes: a heat generator; a heat dissipator; and the graphite composite interposed between the heat generator and the heat dissipator.

BRIEF DESCRIPTION OF DRAWINGS

The figures depict one or more implementations in accordance with the present teaching, by way of example only, not by way of limitations. In the figures, like reference numerals refer to the same or similar elements.

FIG. 1 is a schematic cross-sectional view of an electronic component according to an exemplary embodiment of the present disclosure.

DETAILED DESCRIPTION

The present inventors discovered via experiment that filling the vacancies of a graphite sheet with a resin member would certainly improve the thermal conductivity of the graphite sheet but that when the graphite sheet was actually interposed between a heat generator such as a semiconductor component and a heat dissipator such as a heat sink, transfer of heat from the heat generator to the heat dissipator sometimes could not be increased sufficiently by the graphite sheet.

Thus, the present inventors conducted research and development extensively to provide a graphite composite including a graphite sheet and a resin member and having the ability to increase, when interposed between a heat generator and a heat dissipator, the degree of heat transfer from the heat generator to the heat dissipator and also provide an electronic component including such a graphite composite, thereby conceiving the concept of the present disclosure.

An exemplary embodiment of the present disclosure will now be described. Note that the embodiment to be described below is only an exemplary one of various embodiments of the present disclosure and should not be construed as limiting. Rather, the exemplary embodiment may be readily modified in various manners depending on a design choice or any other factor without departing from the scope of the present disclosure.

A graphite composite 1 according to an exemplary embodiment includes: a graphite sheet having a void inside; and a resin member. The void is partially filled by at least a part of the resin member in its entirety. The proportion of the resin member to the sum of the graphite sheet and the resin member is equal to or greater than 5% by mass. The graphite composite 1 has a porosity equal to or greater than 50% by volume and equal to or less than 95% by volume.

According to this embodiment, the void of the graphite sheet is partially filled by at least a part of the resin member in its entirety and the proportion of the resin member to the sum of the graphite sheet and the resin member is equal to or greater than 5% by mass. Thus, the resin member in the void may reduce the heat resistance of the graphite composite 1 and increase the thermal conductivity of the graphite composite 1. In addition, the graphite composite 1 has a porosity equal to or greater than 50% by volume and equal to or less than 95% by volume, thus making the graphite composite 1 easily deformable when the graphite composite 1 is subjected to compressive pressure. Thus, when interposed between two members, the graphite composite 1 is easily deformable into the shape of the two members. This may increase the areas of contact between the graphite composite 1 and the respective members. Consequently, the transfer of heat may be promoted between the respective members via the graphite composite 1.

Next, the graphite composite 1 according to the present disclosure will be described in further detail.

The graphite sheet is a carbonaceous sheet containing graphite. The graphite sheet may be formed by, for example, heating an organic polymer sheet such as a polyimide sheet.

The graphite sheet has a plurality of voids inside. That is to say, the graphite sheet is porous. The porosity of the graphite sheet is controllable by, for example, adjusting the heating condition when a graphite sheet is formed by heating an organic polymer sheet. A method for measuring the porosity of the graphite sheet will be described later with respect to specific examples of the present disclosure.

The graphite sheet preferably has a porosity equal to or greater than 80% by volume. This may sufficiently increase the porosity of the graphite composite 1. The porosity of the graphite sheet is more preferably equal to or greater than 85% by volume and even more preferably equal to or greater than 90% by volume. Meanwhile, the graphite sheet preferably has a porosity equal to or less than 98% by volume. This may impart good thermal conductivity to the graphite composite 1. The porosity is more preferably equal to or less than 95% by volume.

The graphite sheet may, but does not have to, have a thickness equal to or greater than 20 μm and equal to or less than 400 μm.

The resin member may contain an appropriate organic polymer or silicone resin.

The resin member may contain, for example, a cured product of a reactive curing compound. The reactive curing compound may contain, for example, at least one compound selected from the group consisting of epoxy compounds, acrylic compounds, and silicone compounds.

The resin member preferably contains a soft polymer and preferably contains, for example, a gelatinous polymer. This makes the graphite composite 1 deformable more easily when the graphite composite 1 is subjected to compressive pressure. In addition, this also makes the resin member less damageable even when the graphite composite 1 is deformed.

If the reactive curing compound contains an epoxy compound, then the epoxy compound contains at least one resin selected from the group consisting of: bisphenol A epoxy resins, bisphenol F epoxy resins, glycidyl amine epoxy resins, cresol novolac epoxy resins, and naphthalene epoxy resins. If the reactive curing compound contains an epoxy compound, the reactive curing compound may further contain a curing agent. The curing agent may contain, for example, at least one curing agent selected from the group consisting of phenolic curing agents and dicyandiamide curing agents.

If the reactive curing compound contains a silicone compound, then the silicone compound may be, for example, either reactive curing liquid silicone rubber or a silicone gel. The silicone compound may be a two-component compound or a one-component compound, whichever is appropriate. The silicone compound contains a reactive organic silicon compound such as organo polysiloxane. If the reactive curing compound contains a silicone compound, then the reactive curing compound may further contain a curing agent. The reactive curing compound may further contain a catalyst as needed. The curing agent contains, for example, at least one of organo hydrogen polysiloxane or an organic peroxide. The catalyst may be, for example, a platinum-based catalyst.

If the reactive curing compound contains an acrylic compound, then the acrylic compound contains at least one selected from the group consisting of: alkyl acrylates such as lauryl acrylate; phenoxy diethylene glycol acrylate; methoxy polyethylene glycol acrylate; and an acrylic acid multimer ester.

Note that these are only exemplary components of the reactive curing compound and should not be construed as limiting.

Next, an exemplary method of making the graphite composite 1 will be described. First, a graphite sheet and a reactive composition are provided. The reactive composition may contain only a reactive compound or may contain a solvent, an additive, and other components in addition to the reactive compound.

Next, the graphite sheet is impregnated with the reactive composition. For this purpose, the reactive composition may be applied onto the graphite sheet. Alternatively, the graphite sheet may be immersed in the reactive composition. Subsequently, the reactive composition is dried as needed and then a reactive compound in the reactive composition is allowed to react and thereby cured. In this manner, a resin member is formed as a cured product of the reactive composition and a graphite composite 1 including the graphite sheet and the resin member is obtained. It can be said that in this case, the resin member is adhered to, or impregnated into, the graphite sheet, and the plurality of voids of the graphite sheet are partially filled by at least a part of the resin member.

As described above, the plurality of voids of the graphite sheet in the graphite composite 1 are partially filled by at least a part of the resin member in its entirety. In other words, the plurality of voids of the graphite includes a void partially filled with the resin member (i.e., a void having an internal space filled with no resin member) and/or a void filled with no resin member at all. Optionally, the plurality of voids in the graphite may further include a void entirely filled with the resin member (i.e., a void having no internal space filled with no resin member).

Having the voids of the graphite in the graphite composite 1 partially filled with at least a part of the resin member in its entirety allows the graphite composite 1 to have voids. This makes the graphite composite 1 easily deformable when the graphite composite 1 is subjected to compressive pressure. A method for measuring the porosity of the graphite composite will be described later with respect to specific examples of the present disclosure.

The graphite composite 1 has a porosity equal to or greater than 50% by volume and equal to or less than 95% by volume as described above. Making the porosity equal to or greater than 50% by volume makes the graphite composite 1 easily deformable. The porosity is more preferably equal to or greater than 60% by volume and even more preferably equal to or greater than 70% by volume. Also, making the porosity equal to or less than 95% by volume may impart good thermal conductivity to the graphite composite 1. The porosity is more preferably equal to or less than 90% by volume and even more preferably equal to or less than 85% by volume.

The proportion of the resin member to the sum of the graphite sheet and the resin member is equal to or greater than 5% by mass as described above. This proportion is more preferably equal to or greater than 10% by mass and even more preferably equal to or greater than 40% by mass. This may further increase the thermal conductivity of the graphite composite 1. The proportion of the resin member to the sum of the graphite sheet and the resin member is preferably equal to or less than 85% by mass. This reduces the chances of the void of the graphite sheet being filled with an excessive amount of resin member, thus making the graphite composite 1 more easily deformable when the graphite composite 1 is subjected to compressive pressure. This proportion is more preferably equal to or less than 75% by mass and even more preferably equal to or less than 60% by mass. The amount of the resin member is preferably adjusted to allow the graphite composite 1 to have a desired porosity.

The graphite composite preferably has a compression ratio equal to or greater than 70% when a pressure of 600 kPa is applied to the graphite composite. This makes the graphite composite 1 more easily deformable when the graphite composite 1 is subjected to compressive pressure. Consequently, the transfer of heat may be further promoted between the respective members via the graphite composite 1. The compression ratio is more preferably equal to or greater than 80%. The compression ratio is equal to or less than 95%, for example. As used herein, the "compression ratio" refers to the percentage of the magnitude of decrease in the thickness of the graphite composite 1 when a pressure of 600 kPa is applied to the graphite composite 1 in the thickness direction to the thickness of the graphite composite 1 when no pressure is applied thereto. A method for measuring the compression ratio will be described later with respect to the specific examples of the present disclosure. This makes the graphite composite 1 deformable more easily when the graphite composite 1 is subjected to compressive pressure. Consequently, the transfer of heat may be further promoted between the respective members via the graphite composite 1.

Optionally, with the void of the graphite partially filled by a part of the entire resin member, the surface of the graphite may be covered with another part of the entire resin member. In that case, the surface of the graphite may be only partially covered with the resin member. Alternatively, one surface and the other surface of the graphite in the thickness direction may be entirely covered with the resin member. This allows, when the graphite composite 1 is interposed between two members, the graphite composite 1 to adhere closely to the respective members. In other words, this reduces the chances of leaving a gap between the graphite composite 1 and the respective members. Consequently, the transfer of heat may be further promoted between the respective members via the graphite composite 1.

The graphite composite 1 according to this embodiment is preferably used as a thermal interface material (TIM). As used herein, the "thermal interface material" refers to a material that mediates, when interposed between two members, the transfer of heat between the two members. The foregoing description of the graphite composite 1 is applicable on the premise that the graphite composite 1 is a thermal interface material. Nevertheless, the graphite composite 1 is not necessarily used as a thermal interface material.

Next, an electronic component 10 including a graphite composite 1, which is a thermal interface material, will be described with reference to FIG. 1.

The electronic component 10 includes a heat generator 2, a heat dissipator 3, and the graphite composite 1 according to this embodiment. The graphite composite 1 is interposed between the heat generator 2 and the heat dissipator 3.

The heat generator 2 is a member that generates heat and may be a semiconductor component, for example. The semiconductor component may be, but does not have to be, a transistor, a central processing unit (CPU), a microprocessing unit (MPU), a driver IC, or a memory, for example. The heat generator 2 shown in FIG. 1 includes a heat spreader 22 and a chip part 23 fixed on the heat spreader 22. The heat spreader 22 is a plate member made of a metallic material, for example. The chip part 23 is a semiconductor package, for example. The chip part 23 is disposed on a non-outer peripheral portion of the heat spreader 22. A plurality of screw holes 21 are provided through the outer peripheral portion of the heat spreader 22.

The heat dissipator 3 is a member to which the heat generated by the heat generator 2 is transferred. Heat may be dissipated from the heat dissipator 3. The heat dissipator 3 may be a heat sink, for example. Although the heat dissipator 3 shown in FIG. 1 is a plate heat sink, the heat dissipator 3 may further include radiator fins. The heat dissipator 3 has a plurality of screw holes 31 at respective positions corresponding to the plurality of screw holes 21 of the heat generator 2.

In addition, the outer peripheral portion of the graphite composite 1 also has a plurality of screw holes 11 at respective positions corresponding to the plurality of screw holes 21 of the heat generator 2. The plurality of holes 11 are also provided through the graphite composite 1.

In this embodiment, the graphite composite 1 is directly in contact with each of the heat generator 2 and the heat dissipator 3. Specifically, in this embodiment, the heat generator 2, the graphite composite 1, and the heat dissipator 3 are stacked one on top of another such that the heat spreader 22 of the heat generator 2 faces the heat dissipator 3 and the graphite composite 1 is interposed between the heat generator 2 and the heat dissipator 3. This promotes the transfer of heat between the heat generator 2 and the graphite composite 1 and between the heat dissipator 3 and the graphite composite 1.

Out of each set of screw holes 21, 11, and 31 of the heat generator 2, the graphite composite 1, and the heat dissipator 3, at least the screw hole 31 of the heat dissipator 3 has a female thread on the inner surface thereof. The screw hole 21 of the heat generator 2 and the screw hole 11 of the graphite composite 1 may or may not have a female thread on the inner surface thereof.

Pressure is applied to the graphite composite 1 from the heat generator 2 and the heat dissipator 3. Specifically, in this embodiment, each of the screw holes 21 of the heat generator 2 is aligned with an associated one of the screw holes 11 of the graphite composite 1 and an associated one of the screw holes 31 of the heat dissipator 3. In this state, screws 4 are passed sequentially through these screw holes 21, 11, and 31 in this order and then tightened. This allows the heat generator 2, the graphite composite 1, and the heat dissipator 3 to be fixed to each other and also allows the pressure to be applied to the graphite composite 1 as described above.

According to this embodiment, applying such pressure to the graphite composite 1 causes the graphite composite 1 to be easily deformed to decrease its thickness. At this time, even if the respective shapes of the surface in contact with the graphite composite 1 of the heat generator 2 and the surface in contact with the graphite composite 1 of the heat dissipator 3 do not agree with the surface shapes of the graphite composite 1, the graphite composite 1 may still be easily deformed into the respective shapes of the heat generator 2 and the heat dissipator 3. This allows the graphite composite 1 to adhere closely to the heat generator 2 and the heat dissipator 3. Consequently, transfer of heat from the heat generator 2 to the heat dissipator 3 may be promoted via the graphite composite 1.

In this embodiment, the pressure is applied as described above to the graphite composite 1 by using the screws 4. However, this is not the only method for applying pressure to the graphite composite 1. Alternatively, pressure may also be applied to the graphite composite 1 interposed between the heat generator 2 and the heat dissipator 3 by applying, using a clamp, for example, a load to the heat generator 2 and the heat dissipator 3 in such directions in which the heat generator 2 and the heat dissipator 3 approach each other.

EXAMPLES

1. Making Thermal Interface Material

Each of thermal interface materials according to respective examples and comparative examples was made in the following manner. Specifically, a graphite sheet having any of the porosities and thicknesses shown in the following Table 1 and a two-component silicone gel as a reactive curing compound (product name: WACKER SilGel 612 manufactured by Wacker Asahikasei Silicone Co., Ltd.) were provided. The graphite sheet was impregnated with the silicone gel and then was left at 25° C. for 24 hours, thereby making a graphite composite as a thermal interface material. The surface of the graphite composite was covered with the resin member and the voids of the graphite composite were partially filled with the resin member. Note that in the first comparative example, the graphite sheet was used as it was as the thermal interface material.

The porosity of the graphite sheet was obtained in the following manner. Specifically, a sheet 30 mm square was cut out of the graphite sheet and its weight was measured. In addition, thicknesses at five arbitrary points on the sheet were measured with a micrometer and the volume of the sheet was calculated based on the average of the thicknesses. The density p of the graphite sheet was calculated by dividing the weight of the graphite sheet by the volume of the graphite sheet. Based on this density p of the graphite sheet and a value of 2.2 representing a true specific gravity of graphite, the porosity $\varepsilon$ of the graphite sheet was calculated by $\varepsilon=1-(\rho/2.2)$.

2. Ratio by Volume of Resin Member in Void of Graphite Sheet to the Void

With respect to each of the graphite compositees according to first to fifth examples and second and third comparative examples, the ratio by volume of the resin member in the void of the graphite sheet to the void was measured by the following method. First, the density p' of the graphite composite was calculated by the same method as in the case of the density p of the graphite sheet described above. The weight W' of the resin member include in 1 cm³ of graphite composite was calculated by $W'=(\rho'-\rho)\times 1$. Subsequently, with the specific gravity of the resin supposed to be 1.0, the volume V' of the resin member included in 1 cm³ of the graphite composite was calculated by $V'=W'/1.0$. In addition, based on the porosity $\varepsilon$ of the graphite sheet, the volume V" of the void in 1 cm³ of the graphite sheet was calculated by $V''=\varepsilon\times 1$. Based on these results, the ratio A by volume of the resin member in the void of the graphite sheet to the void was calculated by $A=V'/V''=(\rho'-\rho)/\varepsilon$.

3. Ratio by Mass of Resin Member to Sum of Graphite Sheet and Resin Member

With respect to each of the graphite compositees according to the first to fifth examples and the second and third comparative examples, the ratio B by mass of the resin member to the sum of the graphite sheet and the resin member was calculated, based on the weight W' of the resin member included in 1 cm³ of the graphite composite 1 the density $\rho$ of the graphite sheet, and the density p' of the graphite composite, by $B=W'/(\rho'\times 1)=(\rho'-\rho)/\rho'$.

4. Porosity of Graphite Composite

With respect to each of the graphite compositees according to the first to fifth examples and the second and third comparative examples, the porosity $\varepsilon'$ thereof was calculated, based on the volume V" of the void in 1 cm³ of the graphite sheet, the volume V' of the resin member included in 1 cm³ of the graphite composite, the porosity $\varepsilon$ of the graphite sheet, the density $\rho$ of the graphite sheet, and the density $\rho'$ of the graphite composite, by $\varepsilon'=V''-V'=\varepsilon-(\rho'-\rho)$.

5. Compressibility

With respect to each of the thermal interface materials (each of which was either a graphite composite or a graphite sheet) according to the first to fifth examples and the first to third comparative examples, the compression ratio in a situation where a compressive pressure of 600 kPa was applied thereto in the thickness direction was measured in compliance with the ASTM D5470 standard. The compression ratio is calculated by $(1-T2/T1)\times 100(\%)$, where T1 is the initial thickness of the thermal interface material and T2 is the thickness of the thermal interface material in the situation where a compressive pressure of 600 kPa was applied thereto.

6. Heat Resistance

With respect to each of the thermal interface materials (each of which was either a graphite composite or a graphite sheet) according to the first to fifth examples and the first to third comparative examples, the heat resistance in the thickness direction was measured in compliance with the ASTM D5470 standard:

TABLE 1

| | Graphite sheet's porosity | Graphite sheet's thickness (μm) | Is resin member provided? | Ratio by volume of resin member in graphite sheet's void to the void |
|---|---|---|---|---|
| Example 1 | 94% | 75 | YES | 29% |
| Example 2 | 94% | 75 | YES | 12% |
| Example 3 | 94% | 75 | YES | 45% |
| Example 4 | 94% | 75 | YES | 1% |
| Example 5 | 82% | 75 | YES | 15% |
| Cmp. Ex. 1 | 94% | 75 | NO | — |
| Cmp. Ex. 2 | 94% | 75 | YES | 60% |
| Cmp. Ex. 3 | 94% | 75 | YES | 0.5% |

TABLE 2

| | Ratio by mass of resin member to sum of graphite sheet and the resin member | Graphite composite's porosity | Compression ratio | Heat resistance (K/W) |
|---|---|---|---|---|
| Example 1 | 67% | 67% | 77% | 0.203 |
| Example 2 | 46% | 83% | 87% | 0.212 |
| Example 3 | 76% | 52% | 68% | 0.247 |
| Example 4 | 7% | 93% | 88% | 0.288 |
| Example 5 | 24% | 70% | 51% | 0.274 |
| Cmp. Ex. 1 | 0% | — | 90% | 0.409 |
| Cmp. Ex. 2 | 81% | 38% | 55% | 0.664 |
| Cmp. Ex. 3 | 3% | 93.5% | 90% | 0.401 |

As is clear from the foregoing description of exemplary embodiments and examples, a graphite composite (1) according to a first aspect includes: a graphite sheet having a void inside; and a resin member. The void is partially filled by at least a part of the resin member in its entirety. The proportion of the resin member to the sum of the graphite sheet and the resin member is equal to or greater than 5% by mass. The graphite composite (1) has a porosity equal to or greater than 50% by volume and equal to or less than 95% by volume.

According to the first aspect, the resin member provided in the void of the graphite sheet reduces the heat resistance of the graphite composite (1) and makes the graphite composite (1) easily deformable when the graphite composite (1) is subjected to compressive pressure. This may increase, when the graphite composite (1) is interposed between two members, the thermal conductivity between the two members.

In a graphite composite (1) according to a second aspect, which may be implemented in conjunction with the first aspect, the graphite sheet has a porosity equal to or greater than 80% by volume.

The second aspect makes the graphite composite (1) more easily deformable when the graphite composite (1) is subjected to compressive pressure.

In a graphite composite (1) according to a third aspect, which may be implemented in conjunction with the first or second aspect, the proportion of the resin member to the sum of the graphite sheet and the resin member is equal to or less than 85% by mass.

The third aspect reduces the chances of the void of the graphite sheet being filled with an excessive amount of the resin member, thus making the graphite composite (1) more easily deformable when the graphite composite (1) is subjected to compressive pressure.

In a graphite composite (1) according to a fourth aspect, which may be implemented in conjunction with any one of the first to third aspects, the graphite composite has a compression ratio equal to or greater than 70% when a pressure of 600 kPa is applied to the graphite composite (1) in a thickness direction.

The fourth aspect makes the graphite composite (1) more easily deformable when the graphite composite (1) is subjected to compressive pressure.

In a graphite composite (1) according to a fifth aspect, which may be implemented in conjunction with any one of the first to fourth aspects, the resin member contains a gelatinous polymer.

The fifth aspect makes the graphite composite (1) more easily deformable and less damageable when the graphite composite (1) is subjected to compressive pressure.

In a graphite composite (1) according to a sixth aspect, which may be implemented in conjunction with any one of the first to fifth aspects, the graphite composite (1) is a thermal interface material.

According to the sixth aspect, when the graphite composite (1) is interposed between two members, the thermal conductivity may be increased between the two members.

An electronic component (10) according to a seventh aspect includes: a heat generator (2); a heat dissipator (3); and the graphite composite (1) according to any one of the first to sixth aspects interposed between the heat generator (2) and the heat dissipator (3).

According to the seventh aspect, the heat generated by the heat generator (2) may be transferred to the heat dissipator (3) efficiently via the graphite composite (1).

In an electronic component (10) according to an eighth aspect, which may be implemented in conjunction with the seventh aspect, the graphite composite (1) is directly in contact with each of the heat generator (2) and the heat dissipator (3).

According to the eighth aspect, the heat generated by the heat generator (2) may be transferred to the heat dissipator (3) more efficiently via the graphite composite (1).

In an electronic component (10) according to a ninth eighth aspect, which may be implemented in conjunction with the seventh or eighth aspect, the graphite composite (1) is subjected to pressure applied from the heat generator (2) and the heat dissipator (3).

According to the ninth aspect, the heat generated by the heat generator (2) may be transferred to the heat dissipator (3) more efficiently via the graphite composite (1).

In an electronic component (10) according to a tenth aspect, which may be implemented in conjunction with any one of the seventh to ninth aspects, the heat generator (2) is a semiconductor component and the heat dissipator (3) is a heat sink.

According to the tenth aspect, the heat generated by the semiconductor component may be transferred to the heat sink more efficiently via the graphite composite (1).

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A graphite composite comprising:
a graphite sheet having a void inside; and
a resin member, wherein:
the void is only partially filled by the resin member,
proportion of the resin member to a sum of the graphite sheet and the resin member is equal to or greater than 5% by mass and equal to or less than 75% by mass, and
the graphite composite has a porosity equal to or greater than 50% by volume and equal to or less than 95% by volume.

2. The graphite composite of claim 1, wherein
the graphite sheet has a porosity equal to or greater than 80% by volume.

3. The graphite composite of claim 1, wherein
the graphite composite has a compression ratio equal to or greater than 70% when a pressure of 600 kPa is applied to the graphite composite in a thickness direction.

4. The graphite composite of claim 1, wherein
the resin member contains a gelatinous polymer.

5. The graphite composite of claim 1, wherein
the graphite composite is a thermal interface material.

6. An electronic component comprising:
a heat generator;
a heat dissipator; and
the graphite composite of claim 1 interposed between the heat generator and the heat dissipator.

7. The electronic component of claim 6, wherein
the graphite composite is directly in contact with each of the heat generator and the heat dissipator.

8. The electronic component of claim 6, wherein
the graphite composite is subjected to pressure applied from the heat generator and the heat dissipator.

9. The electronic component of claim 6, wherein
the heat generator is a semiconductor component and the heat dissipator is a heat sink.

10. A graphite composite comprising:
a graphite sheet having a void inside; and
a resin member, wherein:
the void is only partially filled by the resin member,
proportion of the resin member to a sum of the graphite sheet and the resin member is equal to or greater than 5% by mass,
the graphite composite has a porosity equal to or greater than 50% by volume and equal to or less than 95% by volume, and
the graphite composite has a compression ratio equal to or greater than 70% when a pressure of 600 kPa is applied to the graphite composite in a thickness direction.

11. The graphite composite of claim 1, wherein
the void is filled with 1 vol % to 45 vol % by the resin member.

12. The graphite composite of claim 10, wherein
the void is filled with 1 vol % to 45 vol % by the resin member.

13. The graphite composite of claim 10, wherein
the resin member contains a gelatinous polymer.

14. The graphite composite of claim 10, wherein
the graphite composite is a thermal interface material.

15. An electronic component comprising:
a heat generator;
a heat dissipator; and the graphite composite of claim 10 interposed between the heat generator and the heat dissipator.

16. The electronic component of claim 15, wherein the graphite composite is directly in contact with each of the heat generator and the heat dissipator.

17. The electronic component of claim 15, wherein the graphite composite is subjected to pressure applied from the heat generator and the heat dissipator.

18. The electronic component of claim 15, wherein the heat generator is a semiconductor component and the heat dissipator is a heat sink.

* * * * *